US007739650B2

(12) United States Patent
Torres Robles et al.

(10) Patent No.: US 7,739,650 B2
(45) Date of Patent: Jun. 15, 2010

(54) PRE-BIAS OPTICAL PROXIMITY CORRECTION

(76) Inventors: Juan Andres Torres Robles, 7870 SW. Oak Patch Ct., Wilsonville, OR (US) 97070; Andrew Michael Jost, 15632 SW. 82$^{nd}$ Ave., Tigard, OR (US) 97224; Mark C. Simmons, 29146 SW. Courtside Dr., Wilsonville, OR (US) 97070; George P. Lippincott, 16711 Gary La., Lake Oswego, OR (US) 97034

( * ) Notice: Subject to any disclaimer, the term of this patent is extended or adjusted under 35 U.S.C. 154(b) by 320 days.

(21) Appl. No.: 11/673,515

(22) Filed: Feb. 9, 2007

(65) Prior Publication Data
US 2008/0195996 A1 Aug. 14, 2008

(51) Int. Cl.
*G06F 17/50* (2006.01)

(52) U.S. Cl. .......................................... 716/21; 716/19
(58) Field of Classification Search .................. 716/19, 716/21
See application file for complete search history.

(56) References Cited

U.S. PATENT DOCUMENTS

| 4,532,650 | A | 7/1985 | Wihl et al. |
| 4,762,396 | A | 8/1988 | Dumant et al. |
| 5,396,584 | A | 3/1995 | Lee et al. |
| 5,502,654 | A | 3/1996 | Sawahata |
| 5,655,110 | A | 8/1997 | Krivokapic et al. |
| 5,723,233 | A | 3/1998 | Garza et al. |
| 5,815,685 | A | 9/1998 | Kamon |
| 5,825,647 | A | 10/1998 | Tsudaka |
| 5,879,844 | A | 3/1999 | Yamamoto et al. |
| 5,991,006 | A | 11/1999 | Tsudaka |
| 6,016,357 | A | 1/2000 | Neary et al. |
| 6,033,814 | A | 3/2000 | Burdorf et al. |
| 6,042,257 | A | 3/2000 | Tsudaka |
| 6,049,660 | A | 4/2000 | Ahn et al. |
| 6,077,310 | A | 6/2000 | Yamamoto et al. |
| 6,080,527 | A | 6/2000 | Huang et al. |
| 6,120,952 | A | 9/2000 | Pierrat et al. |
| 6,128,067 | A | 10/2000 | Hashimoto |
| 6,187,483 | B1 | 2/2001 | Capodieci et al. |
| 6,243,855 | B1 | 6/2001 | Kobayashi et al. |
| 6,249,904 | B1 | 6/2001 | Cobb |

(Continued)

FOREIGN PATENT DOCUMENTS

JP    09-319067    12/1997

(Continued)

OTHER PUBLICATIONS

Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).

(Continued)

*Primary Examiner*—Thuan Do
*Assistant Examiner*—Magid Y Dimyan
(74) *Attorney, Agent, or Firm*—Klarquist Sparkman, LLP

(57) ABSTRACT

A pre-bias optical proximity correction (OPC) method allows faster convergence during OPC iterations, providing an initial set of conditions to edge fragments of a layout based on density conditions near the edge fragments.

17 Claims, 17 Drawing Sheets

U.S. PATENT DOCUMENTS

| | | | |
|---|---|---|---|
| 6,263,299 B1 | 7/2001 | Aleshin et al. | |
| 6,269,472 B1 | 7/2001 | Garza et al. | |
| 6,301,697 B1 | 10/2001 | Cobb | |
| 6,317,859 B1 | 11/2001 | Papadopoulou | |
| 6,415,421 B2 | 7/2002 | Anderson et al. | |
| 6,425,113 B1 | 7/2002 | Anderson et al. | |
| 6,430,737 B1 | 8/2002 | Cobb et al. | |
| 6,453,457 B1 | 9/2002 | Pierrat et al. | |
| 6,467,076 B1 | 10/2002 | Cobb | |
| 6,470,489 B1 | 10/2002 | Chang et al. | |
| 6,487,503 B2 | 11/2002 | Inui | |
| 6,499,003 B2 | 12/2002 | Jones et al. | |
| 6,574,784 B1 | 6/2003 | Lippincott et al. | |
| 6,643,616 B1 | 11/2003 | Granik et al. | |
| 6,649,309 B2 | 11/2003 | Mukherjee | |
| 6,665,856 B1 * | 12/2003 | Pierrat et al. | 716/19 |
| 6,668,367 B2 | 12/2003 | Cobb et al. | |
| 6,718,526 B1 * | 4/2004 | Eldredge et al. | 716/4 |
| 6,748,578 B2 | 6/2004 | Cobb | |
| 6,778,695 B1 | 8/2004 | Schellenberg et al. | |
| 6,792,590 B1 | 9/2004 | Pierrat et al. | |
| 6,815,129 B1 | 11/2004 | Bjorkholm et al. | |
| 6,817,003 B2 | 11/2004 | Lippincott et al. | |
| 6,857,109 B2 | 2/2005 | Lippincott | |
| 6,862,726 B2 | 3/2005 | Futatsuya et al. | |
| 6,887,633 B2 | 5/2005 | Tang | |
| 6,928,634 B2 | 8/2005 | Granik et al. | |
| 6,973,633 B2 | 12/2005 | Lippincott et al. | |
| 6,989,229 B2 | 1/2006 | Lucas et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,047,516 B2 | 5/2006 | Futatsuya | |
| 7,073,162 B2 | 7/2006 | Cobb et al. | |
| 7,155,689 B2 | 12/2006 | Pierrat et al. | |
| 7,155,699 B2 | 12/2006 | Cobb | |
| 7,172,838 B2 | 2/2007 | Maurer et al. | |
| 7,181,721 B2 | 2/2007 | Lippincott et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,281,234 B2 | 10/2007 | Lippincott | |
| 7,293,249 B2 | 11/2007 | Torres Robles et al. | |
| 7,324,930 B2 | 1/2008 | Cobb | |
| 7,367,009 B2 | 4/2008 | Cobb et al. | |
| 7,378,202 B2 | 5/2008 | Granik et al. | |
| 7,392,168 B2 | 6/2008 | Granik et al. | |
| 2002/0026626 A1 | 2/2002 | Randall et al. | |
| 2002/0094680 A1 | 7/2002 | Lin | |
| 2003/0134205 A1 * | 7/2003 | Yu | 430/5 |
| 2003/0208728 A1 | 11/2003 | Pierrat | |
| 2004/0128118 A1 | 7/2004 | Croffie et al. | |
| 2005/0050490 A1 | 3/2005 | Futatsuya et al. | |
| 2005/0149901 A1 | 7/2005 | Tang | |
| 2005/0177810 A1 | 8/2005 | Heng et al. | |
| 2005/0229125 A1 | 10/2005 | Tabery et al. | |
| 2005/0251771 A1 | 11/2005 | Robles | |
| 2005/0278686 A1 | 12/2005 | Word et al. | |
| 2006/0188796 A1 | 8/2006 | Word | |
| 2006/0199084 A1 | 9/2006 | Word | |
| 2006/0200790 A1 | 9/2006 | Shang et al. | |
| 2006/0240342 A1 | 10/2006 | Tang | |
| 2007/0006118 A1 * | 1/2007 | Pierrat et al. | 716/21 |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0204242 A1 | 8/2007 | Brunet et al. | |
| 2007/0204256 A1 | 8/2007 | Brunet et al. | |
| 2008/0141195 A1 | 6/2008 | Robles et al. | |
| 2008/0148217 A1 | 6/2008 | Park | |
| 2008/0166639 A1 | 7/2008 | Park et al. | |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 7/2001 |

OTHER PUBLICATIONS

Bailey et al., "Intensive 2D SEM Model Calibration for 45nm and Beyond," *Proceedings of SPIE*, vol. 6154, 10 pp. (Feb. 21, 2006).

Brist et al., "Illumination Optimization Effects on OPC and MDP," *Proceedings of SPIE*, vol. 5754, pp. 1179-1189 (Mar. 1, 2005).

Brist et al., "Source Polarization and OPC Effects on Illumination Optimization," *Proceedings of SPIE, 25th Annual BACUS Symposium on Photomask Technology*, vol. 5992, pp. 599232-1/9 (Oct. 3, 2005).

Cao et al., "Standard Cell Characterization Considering Lithography Induced Variations," *Design Automation Conference, 43rd ACM/IEEE*, pp. 801-804 (Jul. 24-28, 2006).

Chen et al., "An Automated and Fast OPC Algorithm for OPC-Aware Layout Design," *Int'l Symp. on Quality Electronic Design*, pp. 782-787 (Mar. 26-28, 2007).

Cobb, "Flexible sparse and dense OPC algorithms," *Proceedings of SPIE, Photomask and Next-Generation Lithography Mask Technology XII*, vol. 5853, pp. 693-702 (Apr. 13, 2005).

Cobb et al., "Model-based OPC using the MEEF matrix," *Proceedings of SPIE, 22nd Annual BACUS Symposium on Photomask Technology*, vol. 4889, 10 pp. (Sept. 30-Oct. 4, 2002).

Cobb et al., "Large Area Phase-Shift Mask Design," *Proceedings of SPIE, Symposium on Optical/Laser Microlithography VII*, vol. 2197, pp. 348-360 (Mar. 2-4, 1994).

Cobb et al., "Using OPC to optimize for image slope and improve process window," *Proceeding of SPIE, Photomask Japan*, vol. 5130, pp. 838-846 (Apr. 16-18, 2003).

Cobb et al., "OPC methods to improve image slope and process window," *Proceedings of SPIE: Design and Process Integration for Microelectronic Manufacturing*, vol. 5042, pp. 116-125 (Feb. 27, 2003).

Cobb et al., "Experimental Results on Optical Proximity Correction With Variable Threshold Resist Model," *Proceedings of SPIE: Symposium on Optical Microlithography X*, vol. 3051, pp. 458-468 (Mar. 10-14, 1997).

Cobb et al., "Fast Sparse Aerial Image Calculation for OPC," *Proceedings of SPIE: 15th Annual BACUS Symposium on Photomask Technology and Management*, vol. 2621, pp. 534-545 (Sept. 20-22, 1995).

Cobb et al., "Fast, Low-Complexity Mask Design," *Proceedings of SPIE: Symposium on Optical/Laser Microlithography VIII*, vol. 2440, pp. 313-327 (Feb. 22-24, 1995).

Cobb et al., "Mathematical and CAD Framework for Proximity Correction," *Proceedings of SPIE: Symposium on Optical Microlithography IX*, vol. 2726, pp. 208-222 (Mar. 13-15, 1996).

Cobb et al., "New Concepts in OPC," *Proceedings of SPIE: Optical Microlithography XVII*, vol. 5377, pp. 680-690 (Feb. 24, 2004).

Dammel, "Photoresist for microlithography, or the Red Queen's race," *J. Microlithogr. Microfabrication Microsyst.*, vol. 1, pp. 270-275 (Oct. 2002).

Drapeau et al., "Double patterning design split implementation and validation for the 32nm node," *Proc. SPIE*, vol. 6521, pp. 652109-1 through 652109-15 (2007).

Granik, "Generalized MEEF Theory," *Interface 2001*, 13 pp. (Nov. 2001).

Granik, "New Process Models for OPC at sub-90nm Nodes," *Proceedings of SPIE: Optical Microlithography XVI*, vol. 5040, pp. 1166-1175 (Feb. 25, 2003).

Granik, "Solving Inverse Problems of Optical Microlithography," *Proceedings of SPIE: Optical Microlithography XVIII*, vol. 5754, pp. 506-526 (Mar. 1, 2005).

Granik et al., "MEEF as a Matrix," *Proceedings of SPIE: 21st Annual BACUS Symposium on Photomask Technology*, vol. 4562, pp. 980-991 (Oct. 2-5, 2001).

Granik et al., "Two-Dimensional G-MEEF Theory and Applications," *Proceedings of SPIE: Symposium on Photomask and Next-Generation Lithography Mask Technology IX*, vol. 4754, pp. 146-155 (Apr. 23-25, 2002).

Granik et al., "Universal Process Modeling with VTRE for OPC," *Proceedings of SPIE: Optical Microlithography XV*, vol. 4691, pp. 377-394 (Mar. 5, 2002).

Gupta et al., "Manufacturing-Aware Physical Design," *Computer Aided Design*, pp. 681-687 (Nov. 9-13, 2003).

Hajj, Intel's AMT enables rapid processing and info-turn for Intel's DFM test chip vehicle, *Proc. SPIE*, vol. 6730, pp. 67300Q-1 through 67300Q-13 (2007).

Hong et al., "Impact of Process Variance on 65 nm Across-Chip Linewidth Variation," *Proceedings of SPIE: Design and Process Integration for Microelectronic Manufacturing IV*, vol. 6156, pp. 61560Q1-9 (Feb. 23, 2006).

Hoppe et al., "Beyond rule-based physical verification," *Proc. SPIE*, vol. 6349, pp. 63494X.-1 through 63494X-9 (2006).

Li et al., "Transferring Optical Proximity Correction (OPC) Effect into Optical Mode," *Int'l Symp. on Quality Electronic Design*, pp. 771-775 (Mar. 26-28, 2007).

Liebmann, "Layout Impact of Resolution Enhancement Techniques: Impediment or Opportunity?" *Proceedings of the 2003 International Symposium on Physical Design*, pp. 110-117 (Apr. 6-9, 2003).

Lucas et al., "Reticle Enhancement Verification for 65 nm and 45 nm Nodes," *Proceedings of SPIE: Design and Process Integration for Microelectronic Manufacturing IV*, vol. 6156, pp. 61560Q1-9 (Feb. 23, 2006).

Luk-Pat et al., "Correcting Lithography Hot Spots during Physical-Design Implementation," *Proceedings of SPIE: Photomask Technology 2006*, vol. 6349, p. 634920-1 through 634920-9 (Sept. 19, 2006).

Maurer et al., "Evaluation of a fast and flexible OPC package: OPTISSIMO," *Proceedings of SPIE: 16th Annual Symposium on Photomask Technology and Management*, vol. 2884, pp. 412-418 (Sept. 18-20, 1996).

Maurer et al., "Process Proximity Correction using an automated software tool," *Proceedings of SPIE: Optical Microlithography XI*, vol. 3334, pp. 245-253 (Feb. 22-27, 1998).

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Mentor Graphics Corporation, News and Views, "Calibre," including a partial translation, 9 pp. (document marked Apr. 2000).

Ohnuma et al., "Lithography Computer Aided Design Technology for Embedded Memory in Logic," *Japanese Journal of Applied Physics*, vol. 37(12B), pp. 6686-6688 (Dec. 1998).

Pack et al., "Physical and Timing Verification of Subwavelength-Scale Designs—Part I: Lithography Impact on MOSFETs," *Proceedings of SPIE: Design and Process Integration for Microelectronic Manufacturing*, vol. 5042, pp. 51-62 (Feb. 27, 2003).

Pan, "Lithography-Aware Physical Design," *ASIC*, pp. 35-36 (Oct. 24-27, 2005).

Perry et al., "Model-based Approach for Design Verification and Co-optimization of Catastrophic and Parametric-related Defects due to Systematic Manufacturing Variations," *Proc. SPIE*, vol. 6521, pp. 65210E-1 through 65210E-10 (2007).

Philipsen et al., "Printability of hard and soft defects in 193nm lithography," *Proceedings of SPIE: 18th European Conference on Mask Technology for Integrated Circuits and Microcomponents*, vol. 4764, pp. 95-112 (Jan. 15, 2002).

Pikus et al., "Non-uniform Yield Optimization for Integrated Circuit Layout," *Proceedings of SPIE: Photomask Technology*, vol. 6730, pp. 67300Y-1 through 67300Y-12 (Sept. 18, 2007).

Rieger et al., "Anticipating and controlling mask costs within EDA physical design," *Proceedings of SPIE: Photomask and Next-Generation Lithography Mask Technology X*, vol. 5130, pp. 617-627 (Apr. 16, 2003).

Schacht et al., "Calibration of OPC models for multiple focus conditions," *Proceedings of SPIE: Optical Microlithography XVII*, vol. 5377, pp. 691-703 (Feb. 24, 2004).

Scheffer, "Physical CAD Changes to Incorporate Design for Lithography and Manufacturability," *Proceedings of the 2004 Conference on Asia South Pacific Design Automation*, pp. 768-773 (Jan. 27-30, 2004).

Schellenberg, "Sub-Wavelength Lithography Using OPC," *Semiconductor Fabtech*, 9th ed., pp. 205-209 (Mar. 1999).

Sturtevant et al., "Assessing the Impact of Real World Manufacturing Lithography Variations on Post-OPC CD Control," *Proceedings of SPIE: Design and Process Integration for Microelectronic Manufacturing III*, vol. 5756, pp. 240-254 (Mar. 4, 2005).

Sturtevant et al., "Considerations for the Use of Defocus Models for OPC," *Proceedings of SPIE: Design and Process Integration for Microelectronic Manufacturing III*, vol. 5756, pp. 427-436 (Mar. 4, 2005).

Tawfic et al., "Feedback Flow to Improve Model-Based OPC Calibration Test Pattern," *Proceedings of SPIE: Design for Manufacturability through Design-Process Integration*, vol. 6521, pp. 65211J-1 through 65211J-9 (Feb. 28, 2007).

Torres et al., "Contrast-Based Assist Feature Optimization," *Proceedings of SPIE: Optical Microlithography XV*, vol. 4691, pp. 179-187 (Mar. 5, 2002).

Torres et al., "Design Verification Flow for Model-Assisted Double Dipole Decomposition," *Proceedings of SPIE: Optical Microlithography XV*, vol. 4691, pp. 585-592 (Mar. 5, 2002).

Torres, "Fast LFD: Description, Availability and Considerations," *Mentor User's Meeting at SPIE Advanced Lithography*, 27 pp. (Feb. 26, 2007).

Torres et al., "Integrated Circuit DFM Framework for Deep Sub-Wavelength Processes," *Proceedings of SPIE: Design and Process Integration for Microelectronic Manufacturing III*, vol. 5756, pp. 39-50 (Mar. 4, 2005).

Torres, "Integrated Circuit Layout Design Methodology for Deep Sub-Wavelength Processes," Ph.D. Thesis, Oregon Health and Science University, 68 pp. (Mar. 2005).

Tones et al., "Layout verification in the era of process uncertainty: Requirements for Speed, Accuracy and Process Portability," *BACUS Photomask*, 20 pp. (Sep. 20, 2007).

Torres et al., "Layout verification in the era of process uncertainty: Requirements for Speed, Accuracy, and Process Portability," *Proc. SPIE*, vol. 6730, pp. 67300U-1 through 67300U-9 (published online Oct. 30, 2007).

Torres, "Layout verification in the era of process uncertainty: Target Process Variability Bands Vs Actual Process Variability Bands," *Proc. SPIE*, vol. 6925, pp. 692509-1 through 692509-8 (published online Mar. 4, 2008).

Torres et al., "Model Assisted Double Dipole Decomposition," *Proceedings of SPIE: Optical Microlithography XV*, vol. 4691, pp. 407-417 (Mar. 5, 2002).

Torres et al., "Process Window Modeling Using Compact Models," *Proceedings of SPIE: 24th Annual BACUS Symposium on Photomask Technology*, vol. 5567, pp. 638-648 (Sept. 14, 2004).

Torres et al. "RET-Compliant Cell Generation for Sub-130 nm Processes," *Proceedings of SPIE: Optical Microlithography XV*, vol. 4691, pp. 529-539 (Mar. 5, 2002).

Torres, "Towards Manufacturability Closure: Process Variations and Layout Design," *Electronic Design Process Symposium*, 7 pp. (Apr. 7-8, 2005).

Torres et al., "Unified Process Aware System for Circuit Layout Verification," *Proceedings of SPIE: Design for Manufacturability through Design-Process Integration*, vol. 6521, pp. 652108-1 through 652108-12 (Feb. 28, 2007).

Tsai et al., "Modeling Litho-Constrained Design Layout," *Design Automation Conference*, pp. 354-357 (Jun. 4-8, 2007).

Vasek et al., "SEM-Contour Based Mask Modeling," *Proceedings of SPIE: Optical Lithography XXI*, vol. 6924, pp. 69244Q-1 through 69244Q-11 (Feb. 26, 2008).

Vasek et al., "SEM-contour-based OPC Model Calibration through the Process Window," *Proceedings of SPIE: Metrology, Inspection, and Process Control for Microlithography XXI,* pp. 65180D-1 through 65180D-10 (Feb. 26, 2007).

Word et al. "Advanced Layout Fragmentation and Simulation Schemes for Model Based OPC," *Proceedings of SPIE: Optical Microlithography XVIII,* vol. 5754, pp. 1159-1168 (Mar. 1, 2005).

Word et al., "Lithography yield enhancement through optical rule checking," *Proceedings of SPIE: Advanced Microlithography Technologies,* vol. 5645, pp. 142-153 (Nov. 8, 2004).

Yehia et al., Simultaneous Model-Based Main Feature and SRAF Optimization for 2D SRAF Implementation to 32 nm Critical Layers, *Proceedings of SPIE: Photomask Technology,* vol. 6730, pp. 67302K-1 through 67302K-10 (Sept. 18, 2007).

Yenikaya et al., "A rigorous method to determine printability of a target layout," *Proc. SPIE,* vol. 6521, pp. 652112-1 through 652112-12 (2007).

* cited by examiner

*Target*

*Real OPC*

*FPOPC result*

Target

Real OPC

FPOPC result

Target

Real OPC

FPOPC result

*Target*

*Real OPC*

*FPOPC result*

PRE-BIAS OPTICAL PROXIMITY CORRECTION

FIELD OF THE INVENTION

The present invention pertains to the field of Resolution Enhancement Techniques (RET) in photolithography. More particularly, it relates to the use of two-dimensional models to improve the performance of layout corrections using Optical Proximity Correction (OPC) by providing an improved set of initial conditions to the iterative OPC process.

BACKGROUND

In photolithography, a design is transferred onto a surface of a wafer by exposing and selectively etching a pattern of features onto a photo-sensitive material. Although advanced photolithography techniques routinely fit millions of circuit components onto a single chip, the wavelength of the exposing light is too long to produce undistorted layout replicas. OPC (Optical Proximity Correction, or sometimes Optical and Process Correction when effects other than proximity effects are included as well) is a technique that is used to adjust the mask features so that the transferred pattern will be a sufficiently accurate replica of the intended target.

OPC is a computationally expensive calculation that typically requires an iterative calculation of optical, resist, and etch effects. Typically, a figure of merit, such as edge placement error (EPE), is used in conjunction with a feedback factor to adjust the position of the mask edges for the next iteration. Ideally, each iteration improves the result, and the process continues until the EPE of each edge is near zero.

Since each iteration is a time consuming calculation, it is common to use a rule-based approach to provide an initial correction for edges in the layout. This improves the image quality and provides an approximation of the desired result, which normally reduces the number of model-based iterations required.

The rule-based modifications are typically expressed as tables, which characterize each feature of interest by its width and space (to the closest neighbor). While this method has proven to be sufficient for 90 nm processes and larger, it becomes very complex as feature sizes decrease and is no longer practical for advanced device fabrication. For that reason, there is a need for a technique of providing an improved initial set of conditions to a desired layout.

SUMMARY

The present invention is a technique for calculating bias values for layout features prior to the application of OPC modifications. In one embodiment, a model of the OPC process is calibrated by correlating density values in a test layout and a known OPC result. Once the model is calibrated, density signature values for edges in a desired layout pattern are applied to the OPC model to determine a pre-OPC bias value for the edges.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
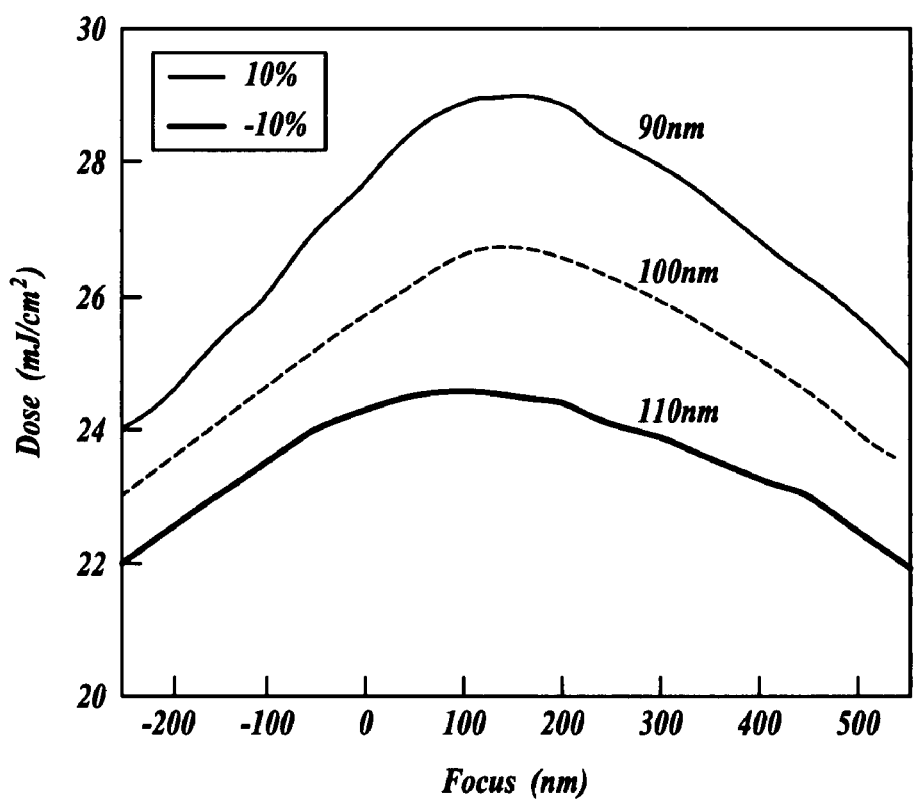
FIG. 1 is a graph showing how critical dimensions of features printed on a wafer vary with changes in focus and dose.
Figure 2:
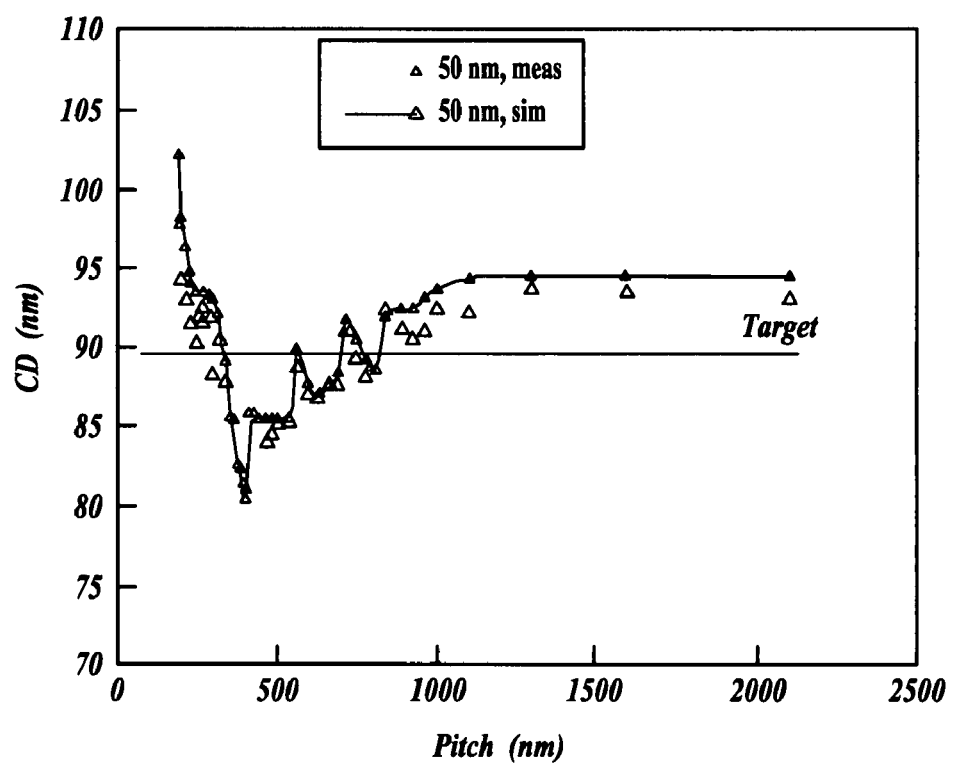
FIG. 2 illustrates how a critical dimension of a feature printed on a wafer changes with distance between features.
Figure 3:
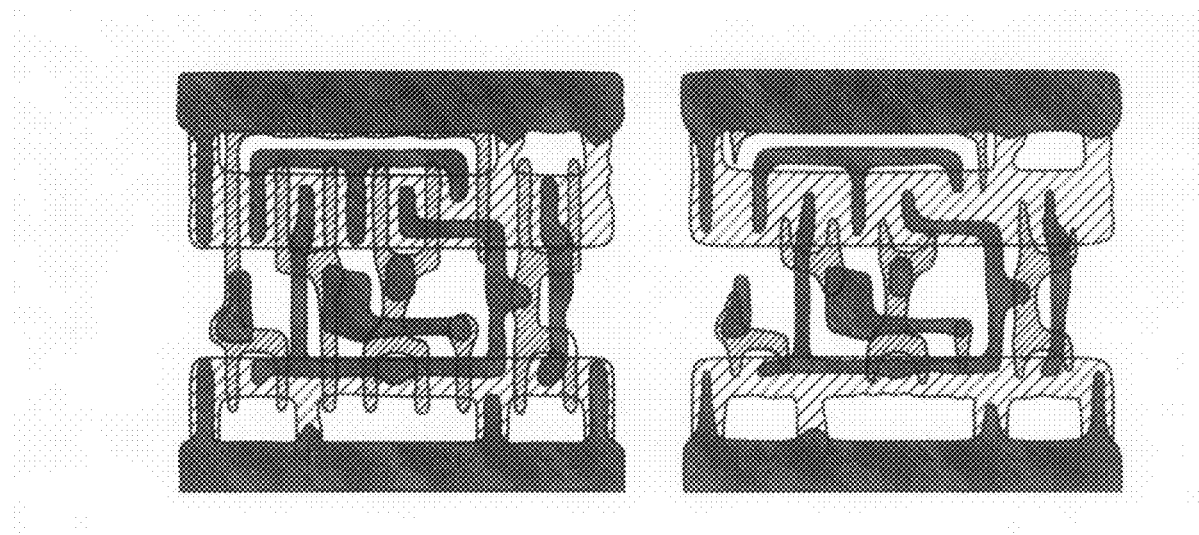
FIG. 3 illustrates features printed with and without OPC.

If only one type of structure is to be imaged onto a wafer, it is possible to select the process parameters to adjust the critical dimension to the desired target, as illustrated in FIG. 1. However, real world integrated circuits or other devices created by a photolithographic process include multiple types of structures in the layout that exhibit a different proximity behavior depending on their neighborhood. FIG. 2 illustrates that the critical dimension of objects in a layout changes with the distance or pitch between objects and that there is no process condition that can simultaneously image all features with the correct target critical dimension. For that reason, Optical Proximity Correction (OPC) is used to adjust the features on the mask by shifting edges either in or out so that the printed results on a wafer will match the target dimensions and allow otherwise non-printing features to resolve, as shown in FIG. 3.

Figure 4:
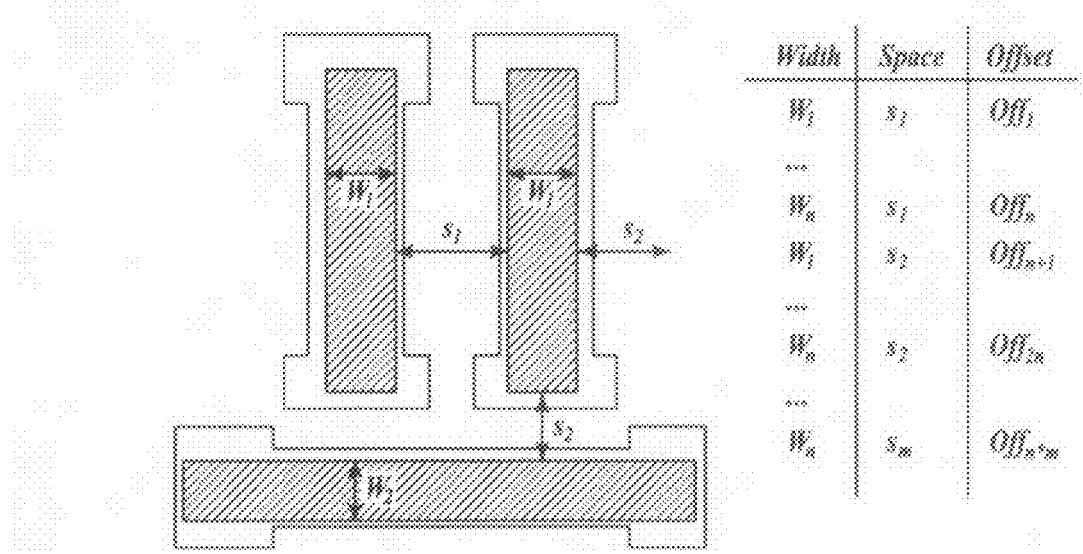
FIG. 4 illustrates a conventional technique of determining OPC biases.

Before the advent of model-based OPC, proximity correction was a simple matter of defining biases based on near-neighbor features. FIG. 4 illustrates a table of offsets or biases that is very well defined for regular one-dimensional structures (i.e., features having a length much greater than their width), but is non-trivial for locations where a feature is separated by two or more distances to its neighbors. In such instances, either new rules need to be applied or more complex tables need to be generated to capture such cases. In either case, the complexity of managing and finding the correct offsets or biases becomes cumbersome and unreliable.

This complexity accelerated the adoption of model-based OPC, in which such tables are not necessary. However, since most OPC techniques are iterative, these tables have persisted as a way to provide a better initial set of conditions before launching the iterative process, thus facilitating convergence and guiding the OPC towards a more robust solution. The rule-based "hints" enable OPC tools to achieve acceptable results with fewer iterations and, therefore, more quickly.

Figure 5:
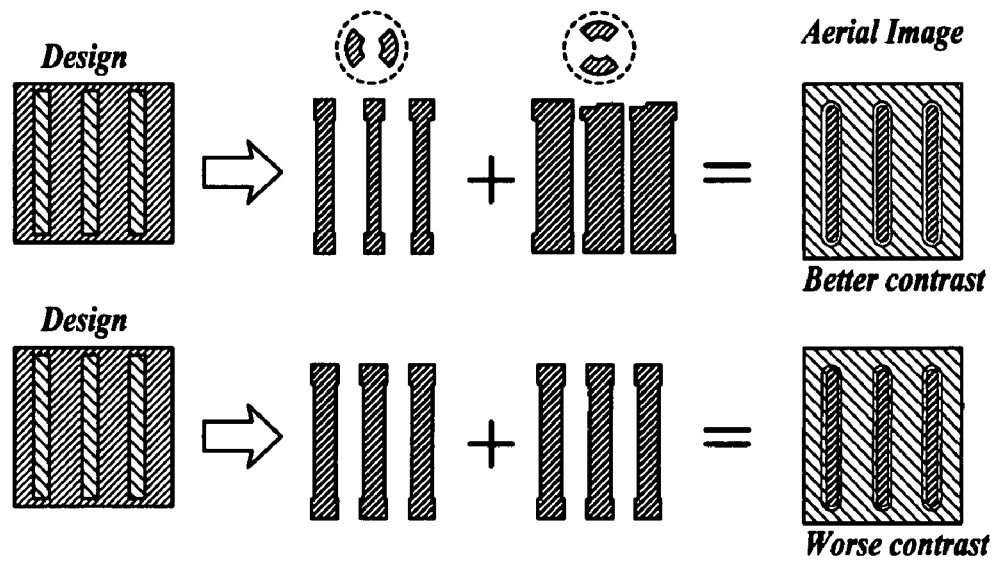
FIG. 5 illustrates how different initial conditions of a feature set can produce different OPC results.

FIG. 5 shows an extreme case (double exposure OPC), in which the aerial image produced by the OPC solution varies widely depending on different initial conditions. In this particular case the only difference between the top split and the bottom split is the improved pre-bias used as input to the OPC tool, thus guiding it to a more robust imaging solution. As this simple example illustrates, it is possible to create pre-OPC bias tables for simple one-dimensional structures, but such approaches tend to be very conservative when applied to more irregular configurations.

Figure 6:
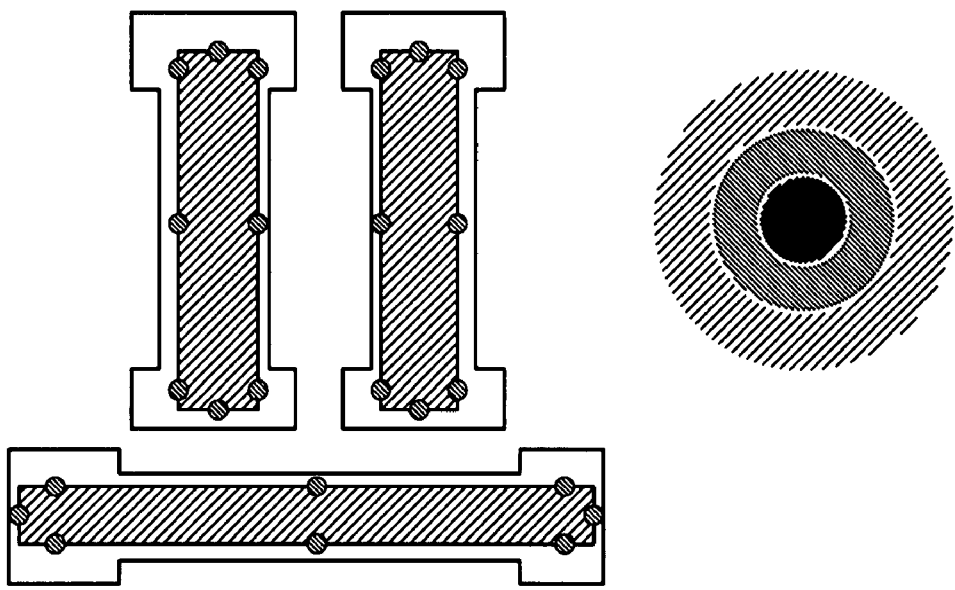
FIG. 6 illustrates sample sites in a set of features and a representative two-dimensional function in accordance with an embodiment of the present invention.

An embodiment of the present invention replaces the need to create very large pre-OPC bias tables for all structures by characterizing layout features according to layout density. As FIG. 6 shows, the method places a number of simulation sites 50a-50d, etc., on layout features where the characterization will be performed. Evaluating densities at the same site locations where the OPC tool will compute the figure of merit for an edge fragment is desirable. In one embodiment, the densities are computed by convolving the layout shapes with two-dimensional functions. This might be done for a single function or for multiple functions. As an example, orthogonal top-hat functions are used. However, this method is not limited to top-hat functions and can easily make use of Gaussian, Laguerrian, sinusoidal, or any arbitrary 2D function. Top-hats were selected for their simplicity and because once their coefficients are found, they can represent a discretized version of any arbitrary radially symmetric 2D function.

Figure 7:
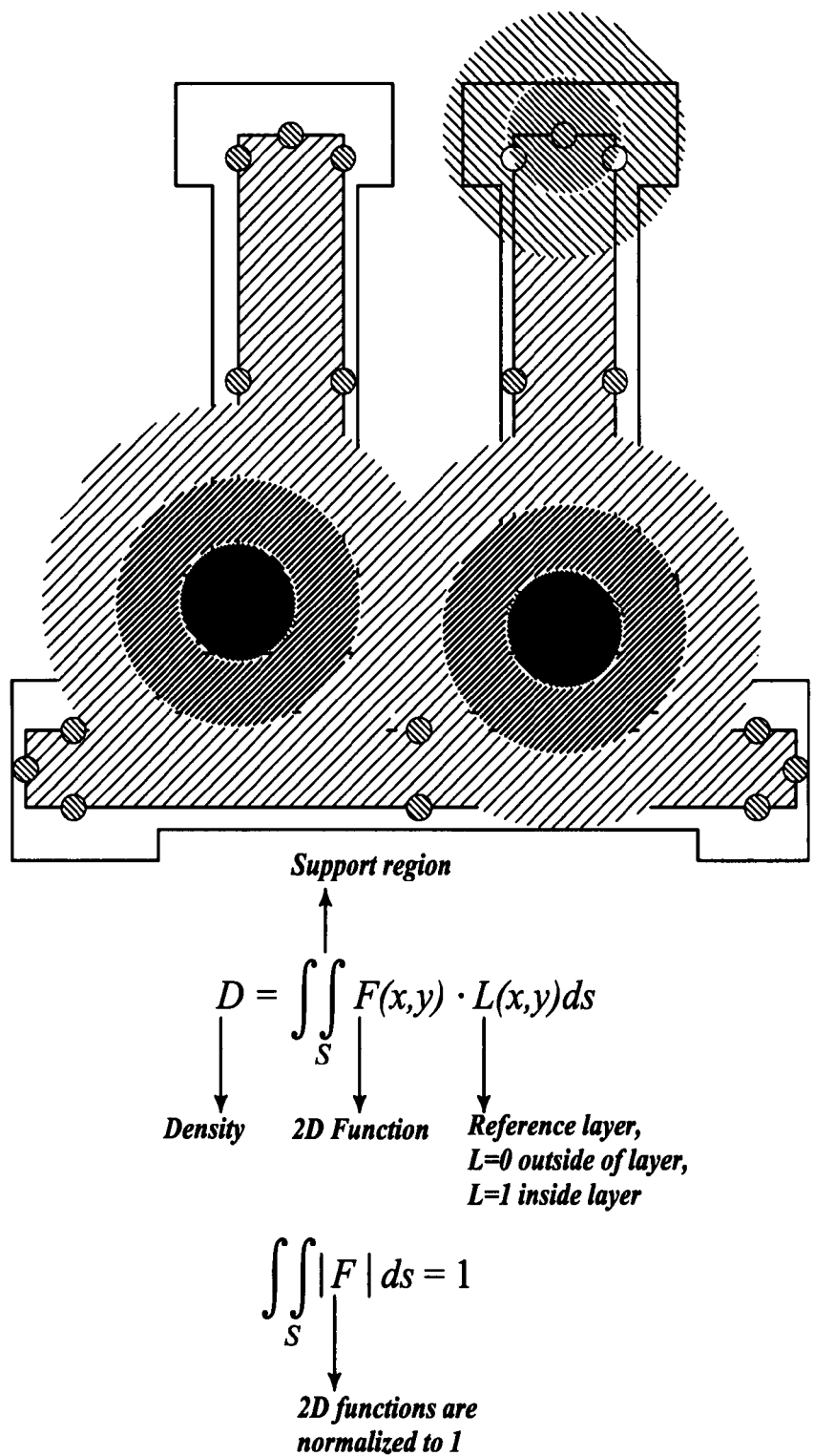
FIG. 7 illustrates one method for calculating a density signature for the edge fragments in accordance with an embodiment of the present invention.

FIG. 7 shows an example of how a 2D function is evaluated at each simulation site on a feature and provides a "density signature" value for an edge fragment that encodes the nature of the layout neighborhood around the simulation site. It also shows how the functions are normalized over the integration surface. In this case, the reference layer is the target layer, which should include any re-targeting bias and other types of aggressive resolution enhancement techniques such as assist features.

In one embodiment of the invention, polygons defining the desired target layer to be created on a wafer are fragmented to define a number of edge fragments around the perimeter of the polygons. Simulation sites are defined for the edge fragments where the OPC tool will calculate the EPE of the edge fragment.

In one embodiment, the density signature D is a vector (i.e., an array) of numbers having values proportional to the area of a kernel overlapping polygons in the layout.

$$D = \int_S \int F(x, y) \cdot L(x, y) ds \quad [1]$$

where the integration covers all 2-dimensional space S, D is the Density value for a particular site, F(x,y) is the kernel, and L(x,y) a function corresponding to the layout, for example $$L(x, y) = \begin{cases} 1 & \text{if within a polygon} \\ 0 & \text{if outside a polygon} \end{cases} \quad [2]$$

A kernel may in turn be made up of a set of smaller kernals, such as a set of concentric top-hat functions. For example, if a top-hat based function F(x,y) is used having five different concentric circles (kernels), each centered over a simulation site, the density signature of the edge fragment may have the form $$[1, D_{1,i}, D_{2,i} \ldots D_{5,i}] \quad [3]$$

where i is the number of the edge fragment, and $D_1$ represents the percentage of the first top-hat kernel that is covering layout features. $D_2$ is the percentage of the second top-hat kernel covering layout features, etc. In one embodiment, the area inside a feature is defined as logic 1 and the area outside a feature is defined as logic 0. If a kernel covers layout features over 50% of its area, then the value of D for that kernel is 0.5. In practice, the a top hat function F(x,y) may include 50+ kernels. Different edge fragments typically will have different density signatures depending on the location of their neighbors. In the case of a top-hat function these results can be thought of as representing area but for the more general case of arbitrary kernels it is necessary to realize that a convolution is being done as shown in FIG. 7.

Figure 8:
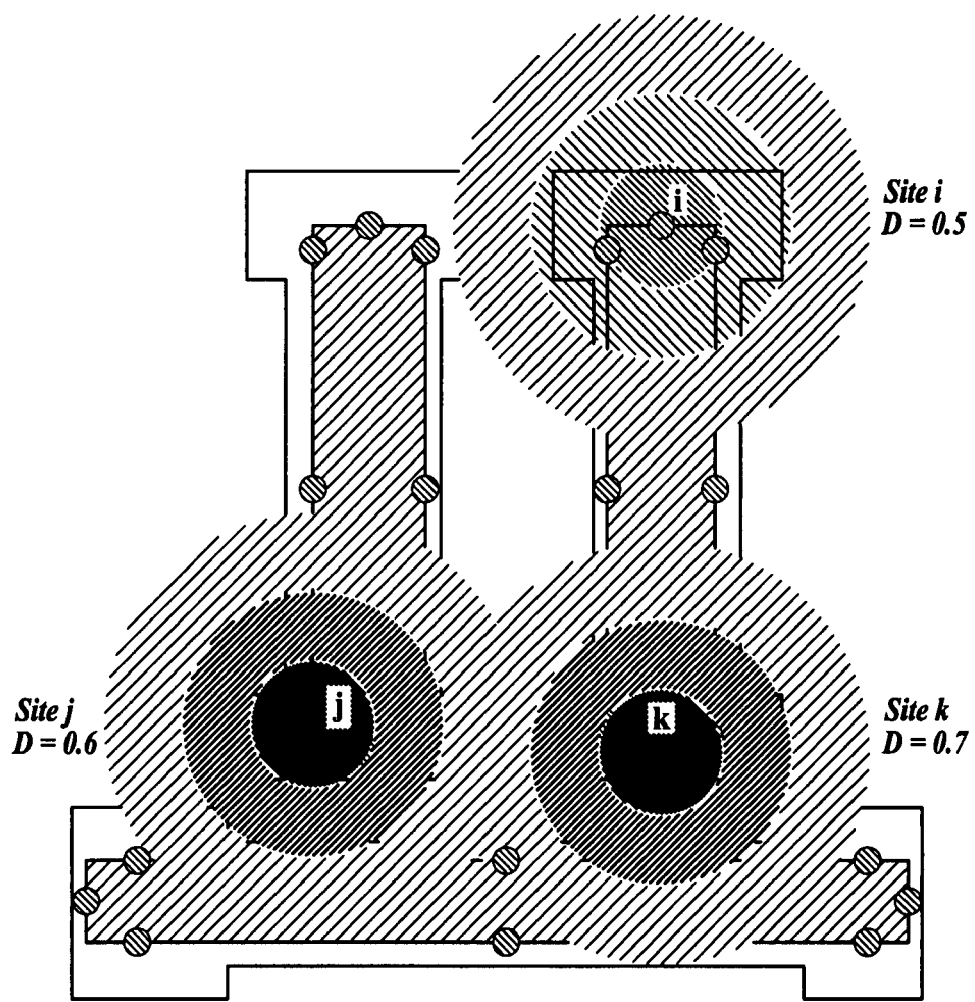
FIG. 8 illustrates calculating a density signature for edge fragments in accordance with an embodiment of the present invention.
Figure 9:
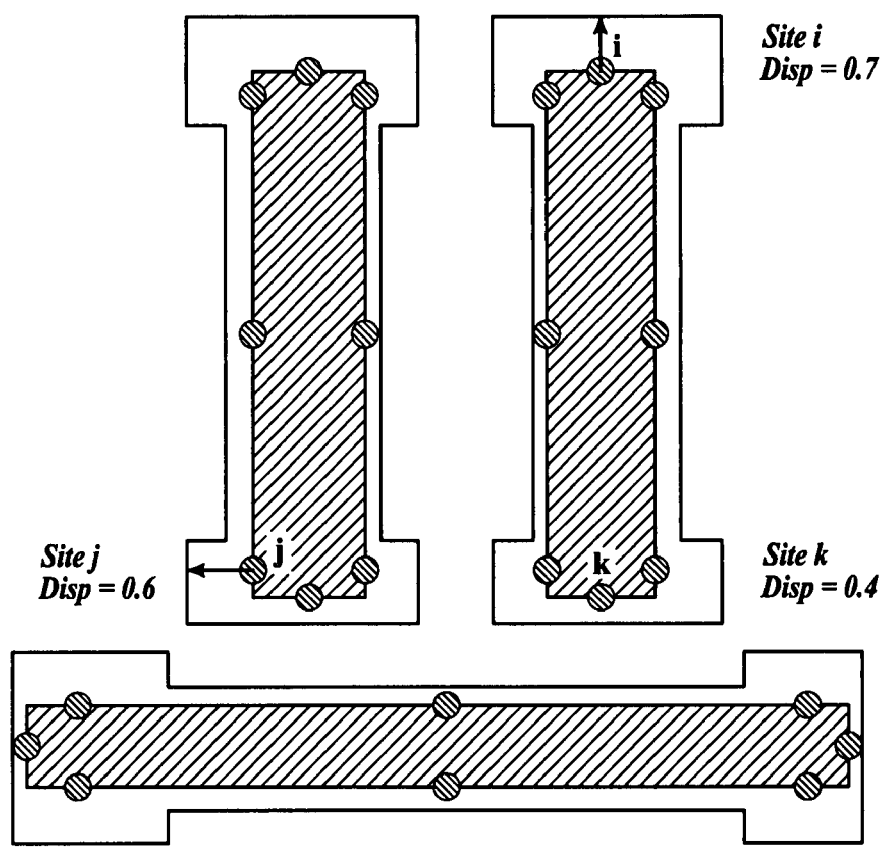
FIG. 9 illustrates how edge fragments are pre-biased in accordance with an embodiment of the present invention.
Figure 10:
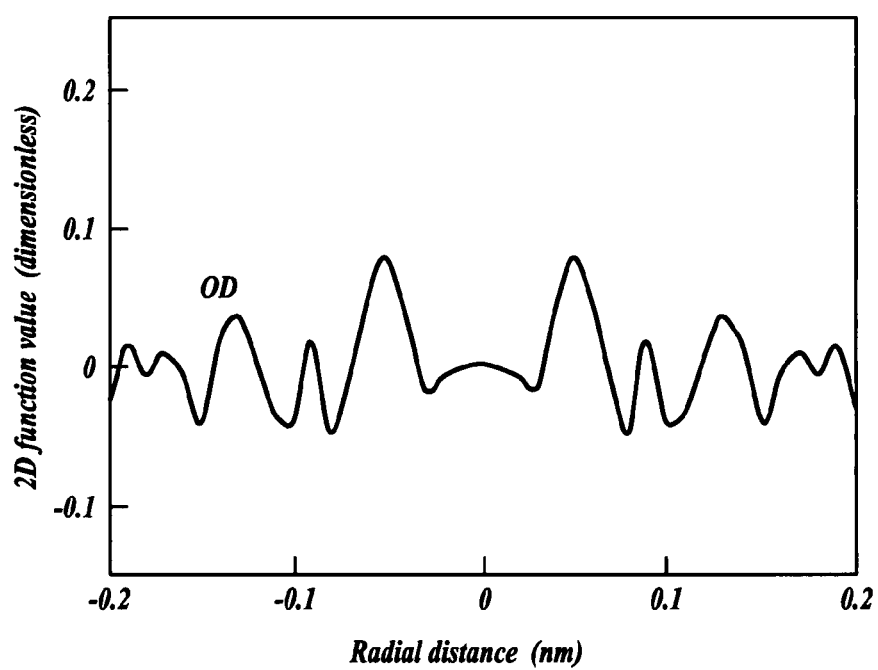
FIGS. 10-15 illustrate cross sections of two-dimensional radially symmetric functions that can be used to compute a density signature of edge fragments in accordance with the present invention.
Figure 11:
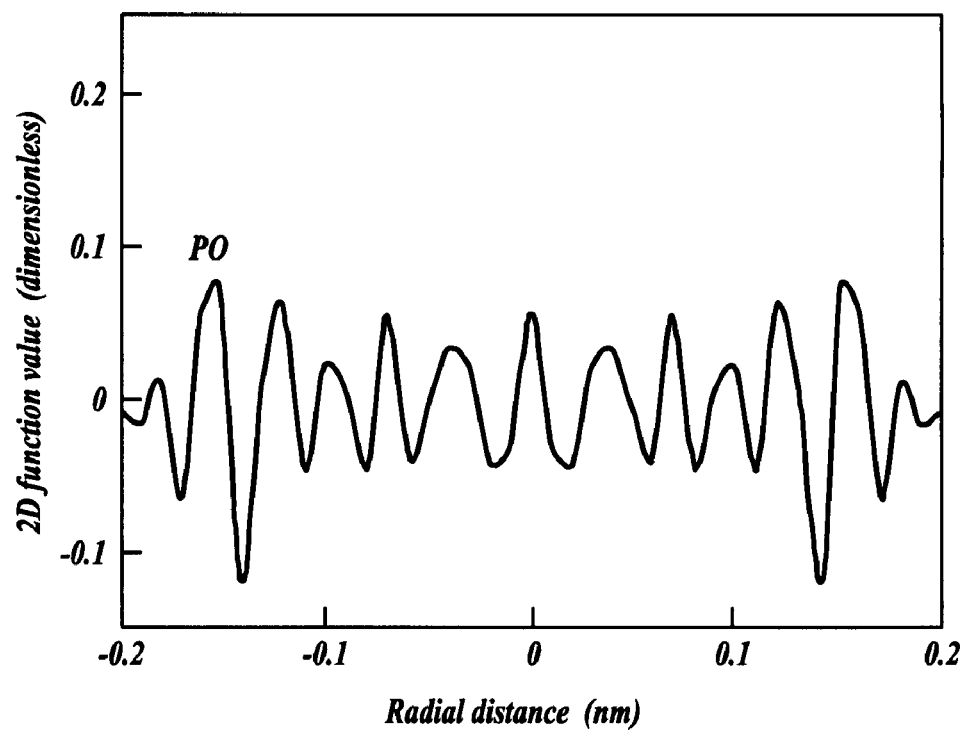
Figure 12:
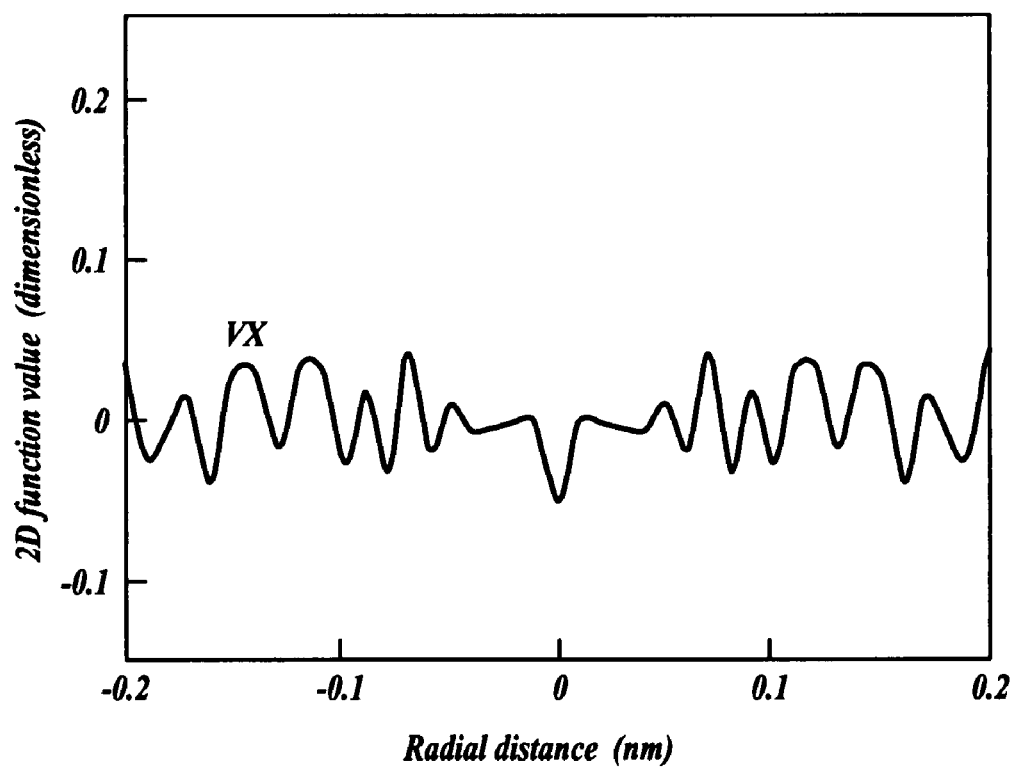
Figure 13:
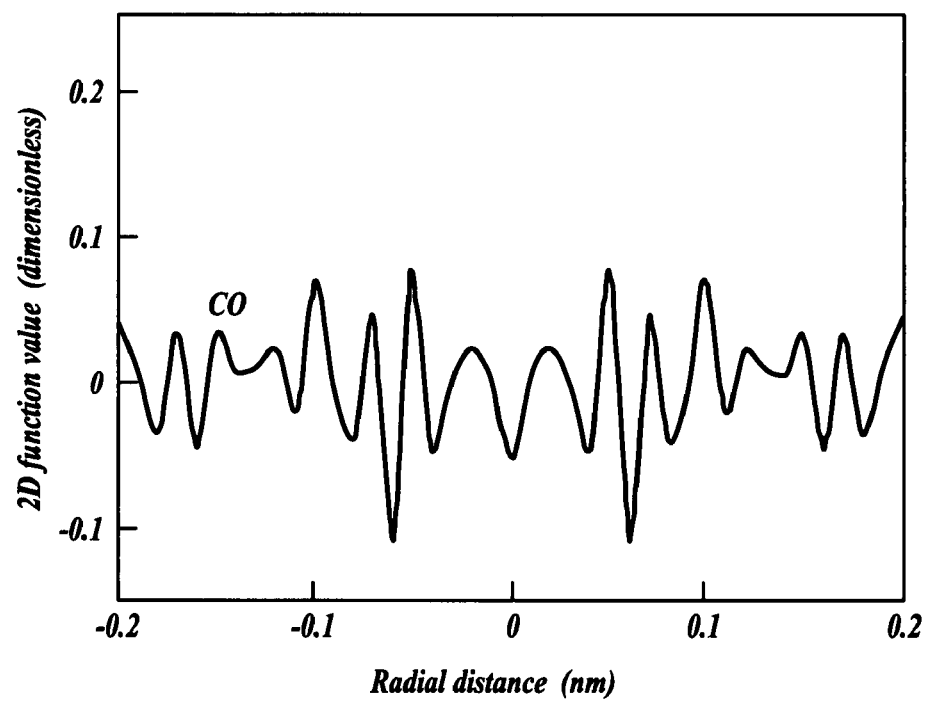
Figure 14:
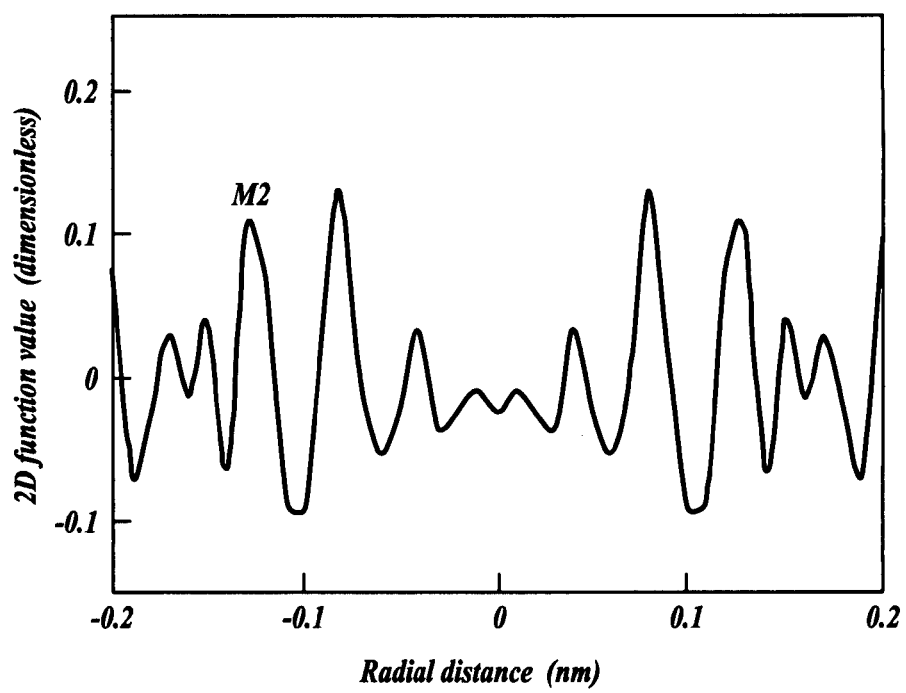
Figure 15:
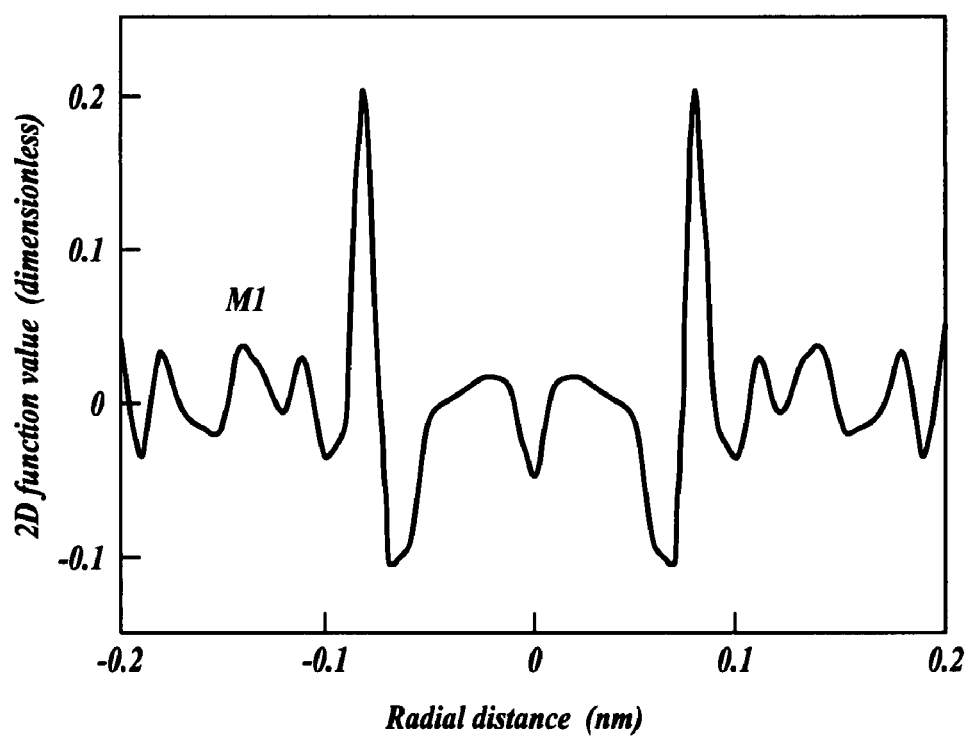
Figure 16:
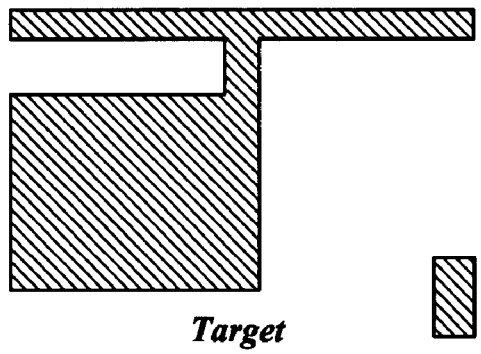
FIGS. 16-19 illustrate a target pattern, a pre-biased feature pattern, and an OPC corrected feature pattern.
Figure 16:
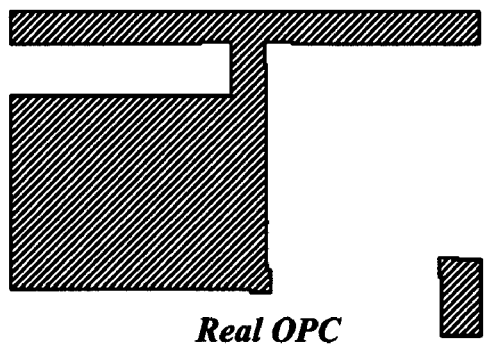
Figure 16:
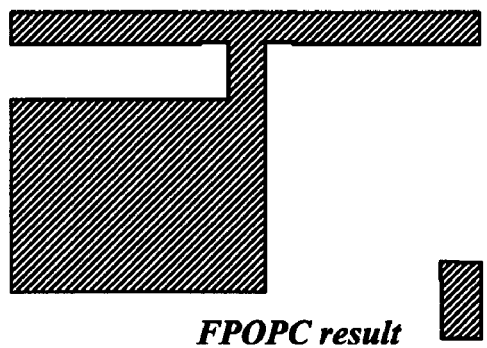
Figure 17:
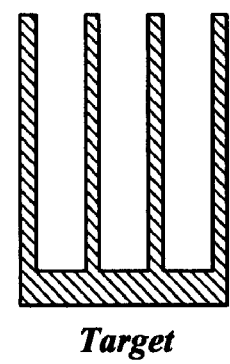
Figure 17:
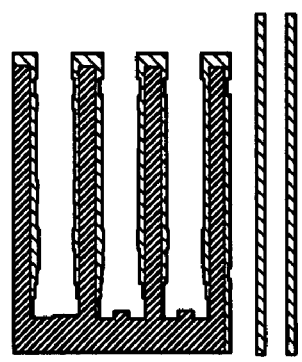
Figure 17:
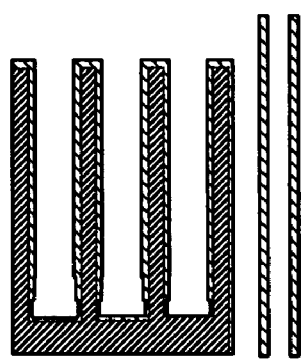
Figure 18:
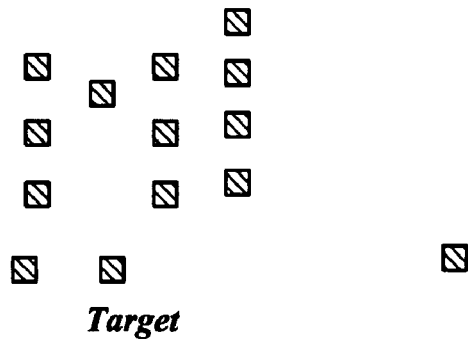
Figure 18:
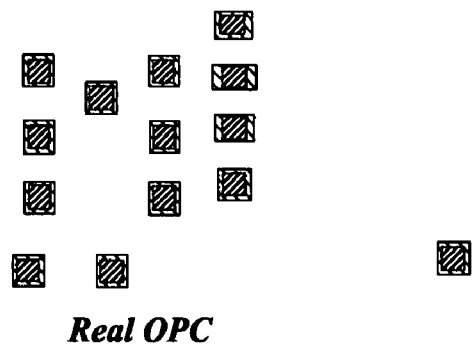
Figure 18:
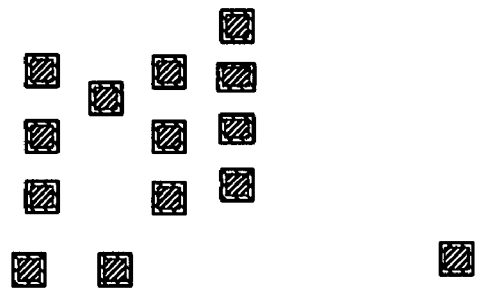
Figure 19:
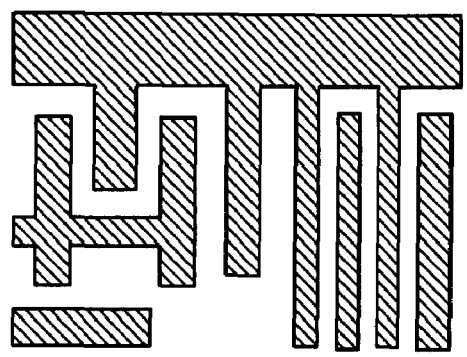
Figure 19:
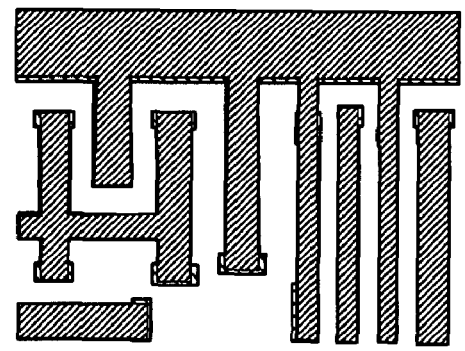
Figure 19:
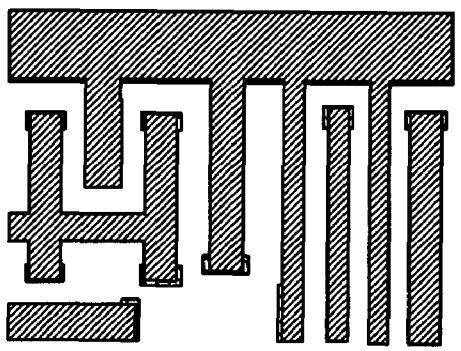

Typically, the functions F(x,y) are normalized $$\int_S \int |F(x, y)| ds = 1 \quad [4]$$

but this is not a requirement for their use. In FIGS. 7 and 8, the rings with different shadings represent that the value at different radial distances can be different. Different normalizations for each kernel and sub-kernal can be different as well.

FIG. 8 shows examples of three simulation sites and the calculated density value, D, at each of the three sites. The kernel is comprised of three concentric top-hat functions, each shown in a different shading If the two-dimensional form of the kernal is monotonically decreasing, then the density value will likewise be a monotonic function of the feature size and spacing. These simple functions do not, however, work well for calculating pre-OPC bias values because the through-pitch behavior of real features is not a monotonic function. To accurately capture and approximate the reference OPC, 2D functions that can sample discretely the layout configurations, such as top-hats or wavelets, are preferred.

Before pre-OPC bias values can be calculated for edges in a desired layout pattern, the OPC model is calibrated to a known OPC solution. Therefore, test layout data, including feature patterns and spacings likely to be used in the actual desired layout, is analyzed with an OPC tool to determine how the feature edges should be moved to print as desired. Next, the test layout data is analyzed to determine the density signatures of the edge fragments in the test data. Finally, a mathematical analysis is performed to correlate the various density signatures to the known OPC correction values. The result of the analysis is a model that models the OPC process itself. In one embodiment, the correlation is determined by solving the following system of non-linear equations set forth in Equation 5 below for various coefficients $\alpha_0, \alpha_1, \alpha_2 \ldots \alpha_m$ $$\begin{bmatrix} 1 & D_{1,1} & \cdots & D_{m,1} \\ 1 & \cdots & \cdots & \cdots \\ 1 & D_{1,n} & D_{2,n} & D_{m,n} \end{bmatrix} \begin{bmatrix} \alpha_0 \\ \alpha_1 \\ \cdots \\ \alpha_m \end{bmatrix} = \begin{bmatrix} Disp_1 \\ \cdots \\ Disp_n \end{bmatrix} \quad [5]$$

from the known density signature values $D_{m,n}$ and the known displacements ($Disp_1, Disp_2, Disp_3$ etc) from the OPC results.

Once the OPC model is calibrated from the test layout data and the known OPC solution, the coefficients $\alpha_i$ represent the relationship between the Density values and the displacements that the OPC procedure will produce. A displacement function Disp that determines a pre-OPC bias amount for a feature edge given its density signature $D_i$ can therefore take the form:

$$Disp = \alpha_0 + \alpha_1 D_1 + \ldots + \alpha_m D_m \quad [6]$$

Other forms are possible, as well, and could include cross terms (such as $\alpha_3 D_1 D_2$) as well as optical terms such those used in model-based OPC.

Since the solution of this system provides a mechanism to predict a first order approximation of the OPC, it is expected that these functions will be very different between process layers and process technologies. Composite 2D functions, calibrated with this method, are shown for several 65 nm layers in FIGS. 10 through 15. These figures show cross-sections of an example of a complicated kernel F(x,y). To visualize the kernel itself, imagine that this pattern is rotated around the y-axis to form a surface where peaks and valleys are the peaks and valleys of the cross-section line. The displacement can be found by convolving the 2-dimensional shapes of the desired layout pattern with this kernel. This kernel could be a single arbitrary kernel or it could be the sum of many simpler kernels (multiplied by a coefficient as determined from the calibration process). These examples are for illustrative purposes and the correct kernel will vary from one process to another.

To qualitatively examine the accuracy of the fast pass OPC method, FIGS. 15-19 show examples of the intended target, the real OPC, and the result of the pre-OPC biases calculated. The pre-OPC bias solutions can qualitatively, and in many cases quantitatively, reproduce the morphology changes produced by the final OPC solution. While the result may not provide the accuracy needed for final photomask creation, the results provide a fast way to create an initial condition prior to beginning OPC.

TABLE 1

Runtime comparison between regular OPC and Pre-bias in seconds.

| Layer | CPU baseline (CPU/Real) | CPU Pre-bias (CPU/Real) |
|---|---|---|
| RX | 185/55 | 8/3 |
| PC | 1062/299 | 43/14 |
| CA | 66/19 | 10/4 |
| M1 | 653/190 | 32/12 |

Table 1 summarizes the relative speed of pre-OPC models with respect to traditional (iterative) OPC.

In one embodiment, the present invention is implemented by a networked or stand alone computer system that executes a sequence of computer instructions. The instructions are stored on a computer storage media such as a CD-ROM, hard disc, DVD, flash memory of the like. Alternatively the instructions may be received by the computer system over a wired or wireless communication link. The computer executes the instructions to read a desired layout pattern or portion thereof and to compute pre-OPC bias amounts for at least some edge fragments in the layout in accordance with the techniques described above.

While illustrative embodiments have been illustrated and described, it will be appreciated that various changes can be made therein without departing from the scope of the invention. It is therefore intended that the scope of the invention is to be determined from the following claims and equivalents thereof.

The embodiments of the invention in which an exclusive property or privilege is claimed are defined as follows:

1. A method of modifying an integrated device layout, comprising:
   receiving polygon layout data representing a desired layout design or portion thereof;
   designating a number of edge fragments of polygons in the polygon layout data;
   determining a density signature of the edge fragments;
   scaling the density signature of the edge fragments by a set of calibrated coefficients; and
   with a computer, modifying the placement of at least one of the designated edge fragments using the scaled density signature.

2. The method of claim 1, wherein the calibrated coefficients are determined from density signatures of edge fragments in a test pattern and a set of known OPC corrections to the edge fragments in the test pattern.

3. The method of claim 1, wherein the density signature for an edge fragment is determined by convolving the edge fragments with a set of radially symmetric functions.

4. The method of claim 3, wherein at least one of the radially symmetric functions is a top-hat kernel.

5. The method of claim 3, further comprising defining at least one simulation site corresponding to the one or more edge fragments, the at least one of the radially symmetric functions centered over the at least one simulation site.

6. The method of claim 1, wherein the density signature for an edge fragment is determined by convolving the edge fragment with a number of concentric top-hat kernels and determining the area of a kernel that is occupied by polygons.

7. The method of claim 1, wherein the method further comprises determining OPC corrections for the edge fragments in the polygon layout data, and wherein the scaling comprises determining a correlation between the density signature of the edge in the test layout pattern and the OPC correction of the edges, and using the correlation to determine a bias for at least one edge in the desired layout data.

8. The method of claim 1, wherein the scaling comprises determining at least one bias value.

9. The method of claim 8, wherein the determining the at least one bias value comprises multiplying at least one density signature value with a corresponding calibrated coefficient.

10. The method of claim 1, further comprising determining one or more OPC corrections for the edge fragments.

11. The method of claim 1, further comprising creating a photomask based at least in part on the modified placement of the at least one of the designated edge fragments.

12. The method of claim 11, further comprising fabricating a chip using the photomask.

13. A computer-readable storage medium storing computer-executable instructions for causing a computer to perform a method of modifying polygon layout data, the method comprising:
   receiving the polygon layout data the polygon layout data representing a desired layout design or portion thereof;
   designating a number of edge fragments of polygons in the polygon layout data;
   determining a density signature of the edge fragments;
   scaling the density signature of the edge fragments by a set of calibrated coefficients; and
   modifying the placement of at least one of the designated edge fragments using the scaled density signature.

14. The computer-readable storage medium of claim 13, wherein the calibrated coefficients are determined from density signatures of edge fragments in a test pattern and a set of known OPC corrections to the edge fragments in the test pattern.

15. The computer-readable storage medium of claim 13, wherein the density signature for an edge fragment is determined by convolving the edge fragments with a set of radially symmetric functions.

16. The computer-readable storage medium of claim 13, wherein the density signature for an edge fragment is determined by convolving the edge fragment with a number of concentric top-hat kernels and determining the area of a kernel that is occupied by polygons.

17. A system, comprising:
means for receiving polygon layout data representing a desired layout design or portion thereof;
means for designating a number of edge fragments of polygons in the polygon layout data;
means for determining a density signature of the edge fragments;
means for scaling the density signature of the edge fragments by a set of calibrated coefficients; and
means for modifying the placement of at least one of the designated edge fragments using the scaled density signature.

* * * * *

UNITED STATES PATENT AND TRADEMARK OFFICE
CERTIFICATE OF CORRECTION

| | | |
|---|---|---|
| PATENT NO. | : 7,739,650 B2 | Page 1 of 1 |
| APPLICATION NO. | : 11/673515 | |
| DATED | : June 15, 2010 | |
| INVENTOR(S) | : Juan Andres Torres Robles et al. | |

It is certified that error appears in the above-identified patent and that said Letters Patent is hereby corrected as shown below:

On the Title Page item 56

Other Publications, Page 3, Column 2, line 38, "Tones" should read --Torres--.

Signed and Sealed this

Ninth Day of November, 2010

David J. Kappos
*Director of the United States Patent and Trademark Office*